United States Patent [19]
Dawson et al.

[11] Patent Number: 5,851,891
[45] Date of Patent: Dec. 22, 1998

[54] IGFET METHOD OF FORMING WITH SILICIDE CONTACT ON ULTRA-THIN GATE

[75] Inventors: Robert Dawson; H. Jim Fulford, Jr., both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 837,521

[22] Filed: Apr. 21, 1997

[51] Int. Cl.[6] .................. H01L 21/336; H01L 21/4763; H01L 21/3205
[52] U.S. Cl. .................. 438/305; 438/592; 438/663; 438/682
[58] Field of Search ................... 438/592, 660, 438/663, 585, 682, 305

[56] References Cited

U.S. PATENT DOCUMENTS

| | | | |
|---|---|---|---|
| 4,107,835 | 8/1978 | Bindell et al. | 29/590 |
| 4,249,968 | 2/1981 | Gardiner et al. | |
| 4,584,760 | 4/1986 | Okazawa et al. | |
| 4,692,348 | 9/1987 | Rubloff et al. | 437/82 |
| 4,803,539 | 2/1989 | Psaras et al. | 357/67 |
| 4,877,755 | 10/1989 | Rodder et al. | |
| 4,886,764 | 12/1989 | Miller et al. | |
| 4,914,046 | 4/1990 | Tobin et al. | |
| 5,086,107 | 2/1992 | Lu . | |
| 5,147,820 | 9/1992 | Chittipeddi et al. | |
| 5,236,865 | 8/1993 | Sandhu et al. | |
| 5,369,302 | 11/1994 | Chen et al. | 257/734 |
| 5,444,024 | 8/1995 | Anjum et al. | 437/200 |
| 5,512,502 | 4/1996 | Ootsuka et al. | 437/41 |
| 5,550,084 | 8/1996 | Anjum et al. | 437/200 |
| 5,554,566 | 9/1996 | Lur et al. | |
| 5,567,638 | 10/1996 | Lin et al. | |
| 5,646,056 | 7/1997 | Lin et al. | |

OTHER PUBLICATIONS

Ng, Kwok K., "Complete Guide to Semiconductor Devices", McGraw–Hill Series in electrical and Computer Engineering, McGraw Hill, Inc., 1995, pp. 632–633.

*Primary Examiner*—Richard A. Booth
*Attorney, Agent, or Firm*—Skjerven, Morrill, Macpherson, Franklin & Friel LLP

[57] ABSTRACT

An IGFET with a silicide contact on an ultra-thin gate is disclosed. A method of forming the IGFET includes forming a gate over a semiconductor substrate, forming a source and a drain in the substrate, depositing a contact material over the gate, and reacting the contact material with the gate to form a silicide contact on the gate and consume at least one-half of the gate. By consuming such a large amount of the gate, a relatively thin gate can be converted into an ultra-thin gate with a thickness on the order of 100 to 200 angstroms. Preferably, the bottom surface of the gate is essentially undoped before reacting the contact material with the gate, and reacting the contact material with the gate pushes a peak concentration of a dopant in the gate towards the substrate so that a heavy concentration of the dopant is pushed to the bottom surface of the gate without being pushed into the substrate. As exemplary materials, the contact material is a refractory metal such as titanium, the gate is polysilicon, and the dopant is arsenic.

40 Claims, 3 Drawing Sheets

IGFET METHOD OF FORMING WITH SILICIDE CONTACT ON ULTRA-THIN GATE

BACKGROUND OF THE INVENTION

1. Field of the Invention

The present invention relates to integrated circuit manufacturing, and more particularly to forming insulated-gate field-effect transistors with silicide contacts.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is activated using a high-temperature anneal that would otherwise melt the aluminum.

An important parameter in IGFETs is the threshold voltage ($V_T$), which is the minimum gate voltage required to induce the channel. For enhancement-mode devices, the positive gate voltage of an N-channel device must be larger than some threshold voltage before a conducting channel is induced, and the negative gate voltage of a P-channel device must be more negative than some threshold voltage to induce the required positive charge (mobile holes) in the channel.

Since it is very important to reduce the series resistance of the gate, source and drain for submicron devices, several techniques have been developed to improve contact resistance. One such approach is to use a refractory metal silicide to contact these regions. With this approach, a thin layer of refractory metal is deposited over the structure, and then heat is applied to form a silicide wherever the refractory metal is adjacent to silicon (including single crystal silicon and polysilicon). Thereafter, an etch is applied that removes unreacted refractory metal over spacers adjacent to opposing sidewalls of the gate to prevent bridging silicide contacts for the gate, source and drain. Various silicides, including PtSi, $MoSi_2$, $CoSi_2$ and $TiSi_2$ have been used for this purpose. For instance, the sheet resistance of titanium silicide ($TiSi_2$) is as low as 3 to 6 $\Omega$/sq, whereas heavily doped polysilicon exhibits a sheet resistance on the order of 15 to 30 $\Omega$/sq. Another advantage to this approach is that the silicide contacts for the gate, source and drain are formed simultaneously and are self-aligned by the spacers. This self-aligned silicide is sometimes referred to as "salicide."

After the silicide contacts are formed, typically an oxide layer is formed over the device, contact windows are etched in the oxide layer to expose the silicide contacts, a blanket layer of metallization is deposited over the oxide layer and into the contact windows to provide interconnect metallization, selected regions of the interconnect metallization are removed, and then a passivation layer is deposited over the substrate.

Although refractory metals and their silicides have adequately high melting points, they usually do not provide suitable replacements for polysilicon as the gate. For instance, the oxides of refractory metals are typically of poor quality, and in some cases volatile (Mo and W oxides). In addition, it may be difficult to obtain consistent threshold voltages due to impurities in the sources of the refractory metals. Polysilicon, on the other hand, has a known work function and forms a highly reliable interface with the underlying gate oxide.

In conventional processes, a polysilicon gate is often used as an implant mask during implantation of source/drain regions, so that essentially none of the dopants that impinge upon the polysilicon gate are implanted into the underlying channel region of the substrate. Otherwise, implanting a substantial amount of such dopants into the channel region may produce unwanted changes to the threshold voltage. The precise thickness needed for a given polysilicon gate will depend on various parameters, such as the implant energy, implant dosage, dopant species, acceptable range of threshold voltages, etc. However, polysilicon gates often have a thickness on the order of 2000 to 3000 angstroms. After the source and drain are formed, if titanium silicide contacts are desired, a typical thickness for a subsequently deposited titanium layer is on the order of 250 angstroms, and after applying a thermal cycle, the ensuing titanium silicide contacts have a thickness of about 600 to 650 angstroms. Although forming the titanium silicide contact on the polysilicon gate consumes several hundred angstroms of polysilicon, the final thickness of the polysilicon gate typically exceeds 1000 angstroms and is far greater than the thickness of the titanium silicide contact. Furthermore, even if a thicker titanium layer is applied, it becomes difficult to form titanium silicide contacts with a thickness that exceeds 1000 angstroms, which in turn limits the amount of polysilicon that will be consumed.

Accordingly, a need exists for a method of fabricating an IGFET that provides a low resistivity gate with the desired work function.

SUMMARY OF THE INVENTION

A primary object of the invention is to provide an IGFET with an ultra-thin gate. This is accomplished using a silicide reaction that consumes a majority of the gate.

In accordance with one aspect of the invention, a method of making an IGFET includes forming a gate over a semiconductor substrate, forming a source and a drain in the substrate, depositing a contact material over the gate, and reacting the contact material with the gate to form a silicide contact on the gate and consume at least one-half of the gate.

By consuming such a large amount of the gate, a relatively thin gate can be converted into an ultra-thin gate with a thickness on the order of 100 to 200 angstroms. This provides for extremely low gate resistance.

In the preferred embodiment, the bottom surface of the gate is essentially undoped before reacting the contact material with the gate, and reacting the contact material with the gate pushes a peak concentration of a dopant in the gate towards the substrate so that a heavy concentration of the dopant is pushed to the bottom surface of the gate without being pushed into the substrate. In this manner, the snowplow effect is utilized by which an advancing silicide phase pushes the encountered dopant towards the substrate in order to heavily dope the gate down to the gate oxide interface. This avoids forming a depletion layer in the gate that might otherwise increase the effective thickness of the gate oxide and reduce drain current.

As exemplary materials, the contact material is a refractory metal such as titanium, the gate is polysilicon, and the dopant is arsenic.

A key advantage of the invention is that a highly miniaturized IGFET can be provided with an ultra-thin polysilicon gate having a well-controlled doping profile, thereby providing a low-resistance gate as well as the desired threshold voltage and drain current.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
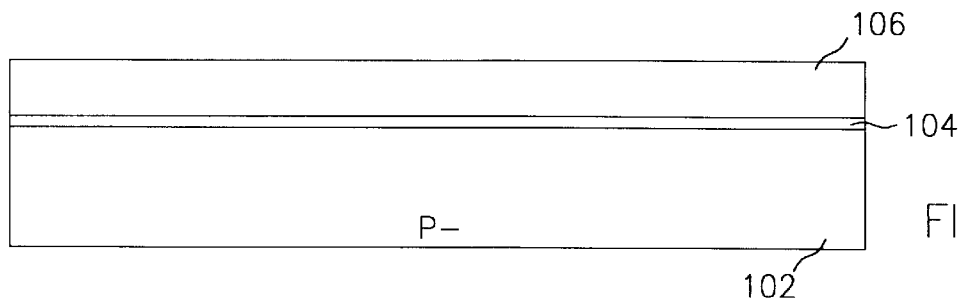
FIGS. 1A–1J show cross-sectional views of successive process steps for forming an IGFET with a silicide contact on an ultra-thin gate in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes a P− type epitaxial surface layer disposed on a P+ base layer (not shown). The epitaxial surface layer provides an active region with a boron background concentration on the order of $1 \times 10^{16}$ atoms/cm$^3$, a <100> orientation and a resistivity of 12 ohm-cm. Substrate 102 can be subjected to a threshold voltage implant, a punch-through implant, and a well implant as is conventional. For convenience of illustration, dielectric isolation such as field oxides between adjacent active regions is not shown. A blanket layer of gate oxide 104, composed of silicon dioxide (SiO$_2$), is formed on the top surface of substrate 102 using tube growth at a temperature of 700° to 1000° C. in an O$_2$ containing ambient. Gate oxide 104 has a thickness in the range of 30 to 100 angstroms. Thereafter, a blanket layer of undoped polysilicon 106 is deposited by low pressure chemical vapor deposition (LPCVD) on the top surface of gate oxide 104. Polysilicon 106 has a thickness of 750 angstroms. If desired, polysilicon 106 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 10 kiloelectron-volts. However, it is generally preferred that polysilicon 106 be initially doped after a subsequent etch step as described below.

Figure 1B:
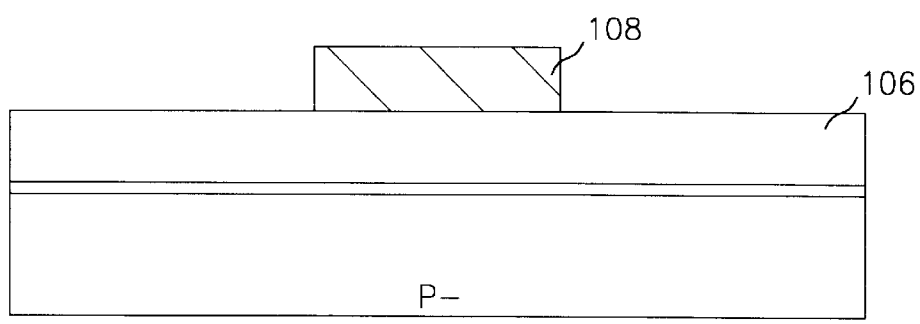

In FIG. 1B, photoresist 108 is deposited on polysilicon 106 and patterned to selectively expose polysilicon 106. Photoresist 108 is patterned using a photolithographic system, such as a step and repeat optical projection system, in which deep ultraviolet light from a mercury-vapor lamp is projected through a reticle and a focusing lens to obtain the desired image pattern. For illustration purposes, the minimum resolution of the photolithographic system is 3500 angstroms (0.35 microns). Thereafter, photoresist 108 is developed and the irradiated portions are removed, so that photoresist 108 has a length (or linewidth) of 3500 angstroms.

Figure 1C:
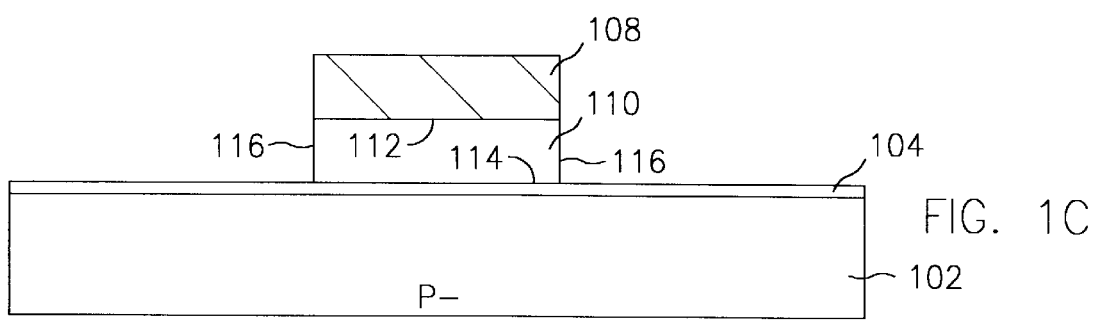

In FIG. 1C, a dry etch is applied that removes polysilicon 106 outside photoresist 108 while photoresist 108 protects the underlying portions of polysilicon 106. The remaining (unetched) polysilicon 106 provides polysilicon gate 110. The dry etch is highly selective of polysilicon and non-selective of silicon dioxide so that only a negligible amount of gate oxide 104 is removed and substrate 102 is unaffected. After etching occurs, gate 110 includes planar top surface 112, planar bottom surface 114, and opposing vertical sidewalls 116. Gate 110 has a thickness (or distance between surfaces 112 and 114) of 750 angstroms, and a length (or distance between sidewalls 116) of 3500 angstroms.

Figure 1D:
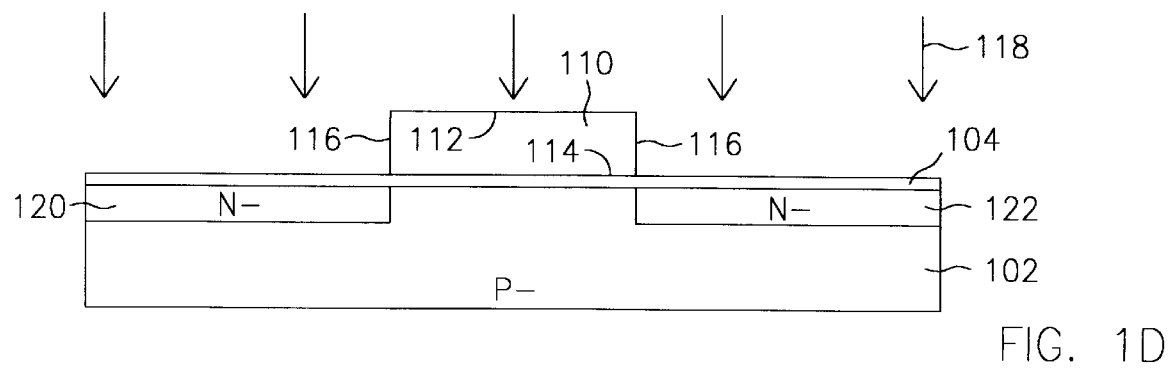

In FIG. 1D, photoresist 108 is stripped, and lightly doped source and drain regions are implanted into the substrate by subjecting the structure to ion implantation of arsenic, indicated by arrows 118, at a dose in the range of $1 \times 10^{13}$ to $5 \times 10^{14}$ atoms/cm$^2$ and a relatively low implant energy of about 10 kiloelectron-volts, using gate 110 as an implant mask for the underlying region of substrate 102. As a result, lightly doped source/drain regions 120 and 122 are implanted into substrate 102 outside gate 110 and are self-aligned to sidewalls 116 of gate 110. Lightly doped source/drain regions 120 and 122 are doped N− with an arsenic concentration in the range of about $1 \times 10^{17}$ to $5 \times 10^{18}$ atoms/cm$^3$. The arsenic is also implanted into gate 110, although essentially all the arsenic that impinges upon gate 110 is implanted into gate 110 without reaching gate oxide 104 or substrate 102. Furthermore, the arsenic implanted into gate 110 has a peak concentration about 150 angstroms below top surface 112 (and about 600 angstroms above bottom surface 114) and a straggle above and below the peak concentration of about 100 angstroms. As such, essentially none of the arsenic is implanted into the lowest 200 angstroms of gate 110, which remains essentially undoped.

Figure 1E:
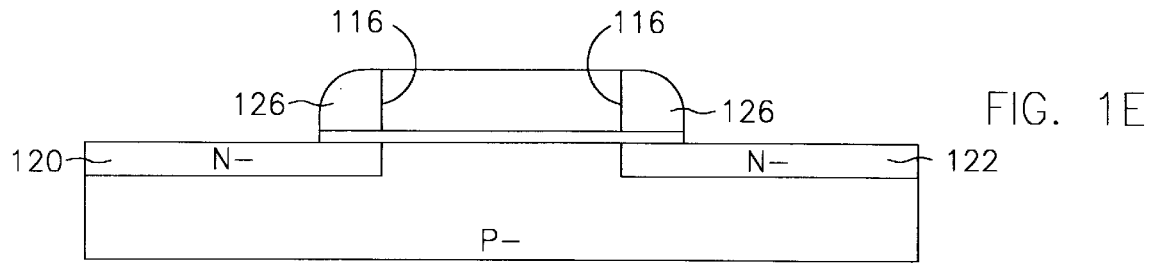

In FIG. 1E, an oxide layer with a thickness of 1500 angstroms is conformally deposited over the exposed surfaces by plasma enhanced chemical vapor deposition at a temperature in the range of 300° to 450° C. Thereafter, the structure is subjected to an anisotropic reactive ion etch that forms oxide spacers 126 adjacent to sidewalls 116. Spacers 126 cover portions of lightly doped source/drain regions 120 and 122.

Figure 1F:
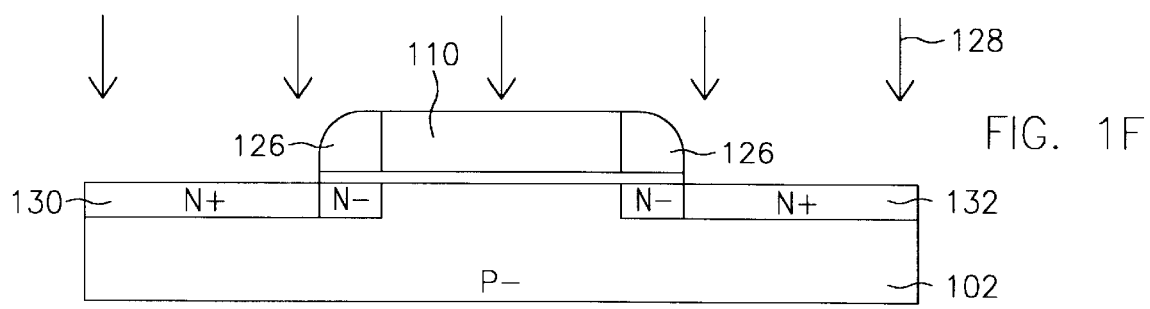

In FIG. 1F, heavily doped source and drain regions are implanted into the substrate by subjecting the structure to ion implantation of arsenic, indicated by arrows 128, at a dose in the range of $1 \times 10^{15}$ to $5 \times 10^{15}$ atoms/cm$^2$ and a relatively low implant energy of about 10 kiloelectron-volts, using gate 110 and spacers 126 as an implant mask for the underlying region of substrate 102. As a result, heavily doped source/drain regions 130 and 132 are implanted in substrate 102 and are self-aligned to the outside edges of spacers 126. Heavily doped source/drain regions 130 and 132 are doped N+ with an arsenic concentration in the range of about $1 \times 10^{18}$ to $1 \times 10^{20}$ atoms/cm$^3$. Furthermore, the peak concentration and straggle of the arsenic indicated by arrows 128 that is implanted into gate 110 are located at about the same positions as those of the arsenic indicated by arrows 118.

Figure 1G:
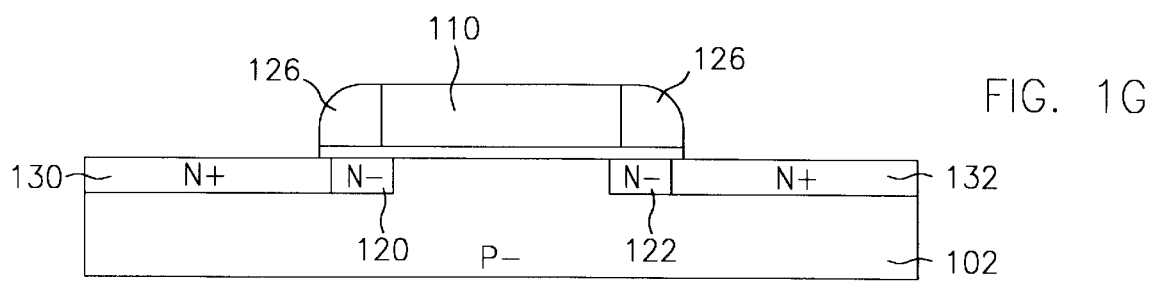

In FIG. 1G, the device is annealed to remove crystalline damage and to drive-in and activate the implanted dopants by applying a rapid thermal anneal on the order of 950° to 1050° C. for 10 to 30 seconds. Source regions 120 and 130 form a source and drain regions 122 and 132 form a drain for an N-channel IGFET in substrate 102 that is controlled by gate 110. Since the arsenic diffuses both vertically and laterally, lightly doped source/drain regions 120 and 122 extend slightly beneath the gate 110, and heavily doped source/drain regions 130 and 132 extend slightly beneath spacers 126. The arsenic, however, tends to diffuse much more slowly than other dopants such as phosphorus and boron. Therefore, the arsenic diffuses only slightly, and the lowest 200 angstroms of gate 110 remains essentially undoped after the drive-in step.

Figure 1H:
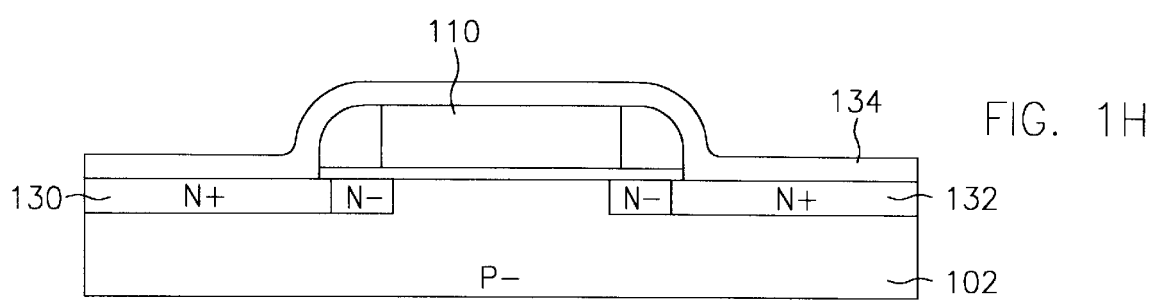

In FIG. 1H, a blanket layer of titanium 134 with a thickness of about 300 angstroms is sputter deposited over substrate 102. Preferably, titanium 134 is deposited directly on gate 110 and heavily doped source and drain regions 130 and 132 without any intervening native oxide. The exposed silicon surfaces can be cleaned by putting substrate 102 into a sputtering system and ion etching or milling away a thin surface layer. Alternatively, a brief wet chemical etch can be used. Other techniques are feasible so long as native oxide or other surface contaminants that might otherwise adversely affect the subsequent formation of silicide contacts are avoided.

Figure 1I:
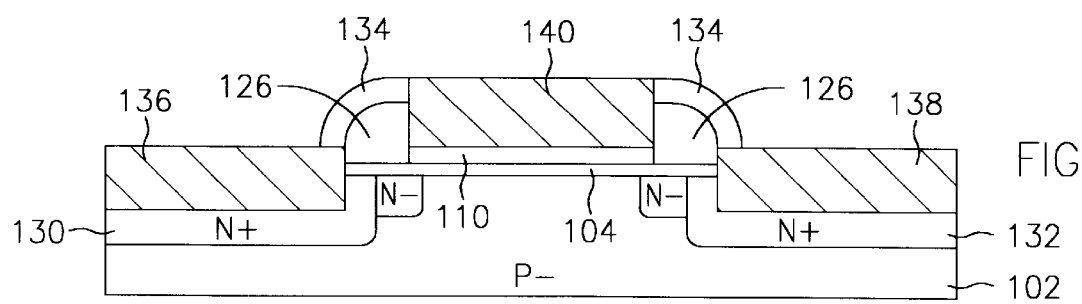

In FIG. 1I, a rapid thermal anneal on the order of 700° C. for 30 seconds is applied in a nitrogen ambient to react titanium 134 with the silicon surfaces that contact it. Silicon atoms in gate 110 and substrate 102 diffuse into and react with the adjacent regions of titanium 134, and the reaction consumes or absorbs a substantial amount of the underlying silicon. The reaction converts titanium 134 into titanium silicide contacts 136, 138 and 140, which are in ohmic contact with heavily doped source region 130, heavily doped drain region 132, and gate 110, respectively. However, titanium 134 on spacers 126 remains unreacted. The ratio of titanium silicide to the original titanium is about 2.5 to 1, so titanium silicide contacts 136, 138 and 140 each have a thickness of about 750 angstroms. Although the theoretical ratio of consumed silicon to titanium is reported as about 2.3 to 1, Applicants find that in actual practice, this ratio is about 2 to 1. Therefore, titanium silicide contacts 136 and 138 each consume about 600 angstroms of substrate 102, and titanium silicide contact 140 consumes about 600 angstroms of gate 110. Advantageously, in doing so, the reaction drastically reduces the thickness of gate 110 from about 750 angstroms to about 150 angstroms, thereby converting gate 110 from a relatively thin gate into an ultra-thin gate.

Furthermore, the arsenic implanted into gate 110 is pushed towards substrate 102 in snowplow fashion. That is, the invention makes use of the so-called "snowplow" effect in which a dopant can be piled up in front of an interface during its growth motion. In particular, as titanium silicide contact 140 is formed, the interface between titanium silicide contact 140 and gate 110 advances beyond both the peak concentration and straggle of the arsenic implanted into gate 110. The advancing interface collects and sweeps ahead of it in snowplow fashion most of the arsenic implanted into gate 110. As a result, a narrow accumulation region of arsenic is formed just ahead of the advancing interface. It is contemplated that the accumulation region of arsenic has a higher arsenic concentration than the original peak concentration of the arsenic implanted into gate 110. It is further contemplated that the accumulation region of arsenic provides heavy doping throughout the entire gate 110 after titanium silicide contact 140 is formed. Moreover, although the arsenic is pushed to the interface of gate 110 and gate oxide 104, essentially none of the arsenic is pushed through gate oxide 104 into substrate 102, thereby assuring that the IGFET remains an enhancement-mode device and providing a well-controlled threshold voltage while avoiding a depletion region at the bottom of gate 110 that might otherwise increase the effective thickness of gate oxide 104.

Also, as is seen, titanium silicide contacts 136 and 138 push heavily doped source/drain regions 130 and 132, respectively, further into substrate 102.

Figure 1J:
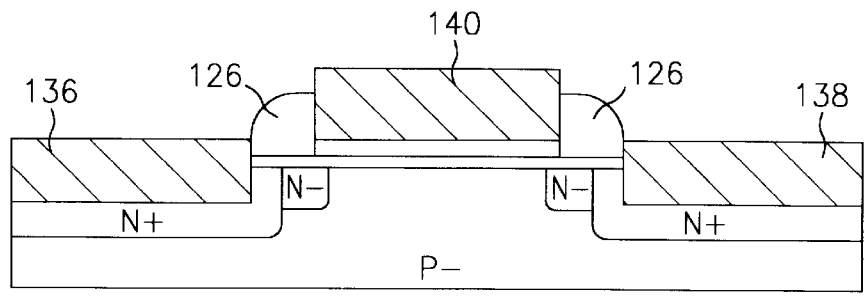

In FIG. 1J, the unreacted titanium (including titanium nitride) on spacers 126 is stripped, and a subsequent anneal at 800° C. for 30 seconds is applied to lower the resistivity of titanium silicide contacts 136, 138 and 140.

Further processing steps in the fabrication of IGFETs typically include forming a thick oxide layer over the active regions, forming contact windows in the oxide layer to expose the silicide contacts, forming appropriate interconnect metallization such as aluminum in the contact windows, and forming a passivation layer. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiment described above. For instance, the gate can be various conductors, and the gate insulator can be various dielectrics. The contact material that is reacted with the gate to form the silicide contacts is preferably a refractory metal. Moreover, a titanium contact material can be deposited on native oxide on the gate, source and drain, since forming titanium silicide contacts reduces or eliminates the native oxide. Therefore, a titanium contact material need not be deposited directly on the gate, source and drain. The subsequent anneal after the unreacted titanium is removed is optional. The conductivity types can be reversed. Suitable N-type dopants include arsenic and phosphorus; suitable P-type dopants include boron $B_{10}$, boron $B_{11}$, and $BF_X$ species such as $BF_2$.

If P-type dopants are implanted into the gate, a nitrided gate oxide may be preferred to reduce or eliminate diffusion of the dopants through the gate oxide into the substrate. Furthermore, the doping concentration of the gate should be limited, since too high a doping concentration may inhibit silicide formation and increase sheet resistance. For instance, the doping concentration of arsenic in the gate should not exceed $2 \times 10^{20}$ atoms/cm$^3$.

Preferably, the contact material consumes at least one-half of the gate, at which point the gate has a thickness of at most 500 angstroms and the silicide contact on the gate is thicker than the gate. More preferably, the contact material consumes at least three-quarters of the gate, at which point the gate has a thickness in the range of 100 to 200 angstroms and the silicide contact on the gate is at least twice as thick as the gate.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET that includes producing an ultra-thin polysilicon gate, comprising the following steps in the sequence set forth:

providing a semiconductor substrate of first conductivity type;

forming a gate oxide on the substrate;

forming a polysilicon gate with a first thickness on the gate oxide;

implanting a dopant of second conductivity type into the polysilicon gate and the substrate;

forming a source and a drain of second conductivity type in the substrate, wherein the source and drain include the dopant;

depositing a refractory metal over the polysilicon gate; and applying a thermal cycle to react the refractory metal with the polysilicon gate and form a silicide contact on the polysilicon gate, wherein reacting the refractory metal with the polysilicon gate consumes at least one-half of the polysilicon gate without entirely consuming the polysilicon gate such that the polysilicon gate has a second thickness of at most 500 angstroms, the first thickness is at least twice the second thickness, and the silicide contact has a greater thickness than the second thickness, and reacting the refractory metal with the polysilicon gate pushes a peak concentration of the dopant in the polysilicon gate towards the substrate in snowplow fashion.

2. The method of claim 1, wherein the second thickness is at most 200 angstroms.

3. The method of claim 1, wherein reacting the refractory metal with the polysilicon gate pushes the peak concentration of the dopant in the polysilicon gate towards the substrate by way of a resultant interface between the silicide contact and the polysilicon gate that advances beyond an original location of the peak concentration of the dopant in the polysilicon gate.

4. The method of claim 1, wherein the polysilicon gate includes a bottom surface adjacent to the gate oxide, a lower region of the polysilicon gate adjacent to the bottom surface of the polysilicon gate is essentially undoped before reacting the refractory metal with the polysilicon gate, and reacting the refractory metal with the polysilicon gate consumes all of the polysilicon gate except for the lower region of the polysilicon gate and pushes a heavy concentration of the dopant into all of the lower region of the polysilicon gate without pushing essentially any of the dopant through the gate oxide into the substrate.

5. The method of claim 1, wherein the refractory metal is titanium.

6. A method of forming an IGFET, comprising the steps of:

forming a gate insulator on a semiconductor substrate;

forming a gate material on the gate insulator;

etching the gate material to form a gate with opposing sidewalls that extend to the gate insulator;

implanting a dopant into the gate;

depositing a contact material over the gate; and reacting the contact material with the gate to form a silicide contact on the gate and consume at least three-quarters of the gate without entirely consuming the gate, wherein a bottom surface of the gate and a lower region of the gate adjacent to the bottom surface of the gate are essentially undoped before reacting the contact material with the gate, and reacting the contact material with the gate pushes the dopant in the gate towards the substrate by way of a resultant interface between the silicide contact and the gate and consumes all of the gate except for the lower region of the gate and pushes a substantial concentration of the dopant into essentially all of the lower region of the gate to provide a substantial concentration of the dopant at the bottom surface of the gate.

7. The method of claim 6, wherein the silicide contact has a thickness that is at least two times that of the gate after reacting the contact material with the gate.

8. The method of claim 6, wherein the silicide contact has a thickness that is at least four times that of the gate after reacting the contact material with the gate.

9. The method of claim 6, wherein the gate has a thickness of at most 500 angstroms after reacting the contact material with the gate.

10. The method of claim 6, wherein the gate has a thickness of at most 200 angstroms after reacting the contact material with the gate.

11. The method of claim 6, including using the IGFET in an integrated circuit chip.

12. The method of claim 6, including using the IGFET in an electronic system that includes a microprocessor, a memory and a system bus.

13. The method of claim 6, wherein reacting the contact material with the gate pushes essentially none of the dopant through the gate insulator into the substrate.

14. The method of claim 6, wherein the contact material is a titanium, the gate is polysilicon and the dopant is arsenic.

15. The method of claim 6, including forming a source and a drain in the substrate after etching the gate material and before depositing the contact material over the gate.

16. The method of claim 15, wherein forming the source and the drain includes:

implanting lightly doped source and drain regions into the substrate using the gate as an implant mask;

forming spacers in close proximity to the sidewalls of the gate that partially cover the lightly doped source and drain regions; and implanting heavily doped source and drain regions into the substrate using the gate and the spacers as an implant mask.

17. The method of claim 16, wherein implanting the lightly doped source and drain regions includes implanting the dopant into the gate.

18. The method of claim 16, wherein implanting the heavily doped source and drain regions includes implanting the dopant into the gate.

19. The method of claim 16, wherein forming the source and the drain includes driving-in and activating the lightly and heavily doped source and drain regions.

20. The method of claim 6, wherein the steps are performed in the sequence set forth.

21. A method of forming an IGFET, comprising the steps of:

forming a gate insulator on a semiconductor substrate;

forming a gate material on the gate insulator;

etching the gate material to form a gate with opposing sidewalls that extend to the gate insulator;

forming a source and a drain in the substrate, including implanting a dopant into the gate, the source and the drain;

depositing a contact material over the gate, the source and the drain; and reacting the contact material with (i) the gate to form a silicide contact on the gate and consume at least one-half of the gate without entirely consuming the gate; (ii) the source to form a silicide contact on the source, and (iii) the drain to form a silicide contact on the drain.

22. The method of claim 21, wherein the silicide contact has a thickness that is at least two times that of the gate after reacting the contact material with the gate.

23. The method of claim 21, wherein the silicide contact has a thickness that is at least four times that of the gate after reacting the contact material with the gate.

24. The method of claim 21, wherein the gate has a thickness of at most 500 angstroms after reacting the contact material with the gate.

25. The method of claim 21, wherein the gate has a thickness of at most 200 angstroms after reacting the contact material with the gate.

26. The method of claim 21, wherein a bottom surface of the gate is essentially undoped before reacting the contact material with the gate, and reacting the contact material with the gate pushes the dopant in the gate towards the substrate by way of a resultant interface between the silicide contact and the gate to provide a substantial concentration of the dopant at the bottom surface of the gate.

27. The method of claim 26, wherein a lower region of the gate adjacent to the bottom surface of the gate is essentially undoped before reacting the contact material with the gate, and reacting the contact material with the gate consumes all of the gate except for the lower region of the gate and pushes a substantial concentration of the dopant into essentially all of the lower region of the gate.

28. The method of claim 26, wherein reacting the contact material with the gate pushes essentially none of the dopant through the gate insulator into the substrate.

29. The method of claim 21, wherein the contact material is a titanium, the gate is polysilicon and the dopant is arsenic.

30. The method of claim 21, including forming the source and the drain after etching the gate material and before depositing the contact material over the gate.

31. The method of claim 30, wherein forming the source and the drain includes:

implanting lightly doped source and drain regions into the substrate using the gate as an implant mask;

forming spacers in close proximity to the sidewalls of the gate that partially cover the lightly doped source and drain regions; and implanting heavily doped source and drain regions into the substrate using the gate and the spacers as an implant mask.

32. The method of claim 31, wherein implanting the lightly doped source and drain regions includes implanting the dopant into the gate.

33. The method of claim 31, wherein implanting the heavily doped source and drain regions includes implanting the dopant into the gate.

34. The method of claim 31, wherein forming the source and the drain includes driving-in and activating the lightly and heavily doped source and drain regions.

35. The method of claim 21, wherein the steps are performed in the sequence set forth.

36. A method of forming an IGFET that includes producing an ultra-thin polysilicon gate, comprising the following steps in the sequence set forth:

forming a gate insulator over a semiconductor substrate;

forming a polysilicon layer on the gate insulator;

etching the polysilicon layer to form a polysilicon gate from an unetched portion of the polysilicon layer, wherein the polysilicon gate includes opposing sidewalls that extend to the gate insulator;

implanting lightly doped source and drain regions into the substrate using the polysilicon gate as an implant mask;

forming spacers in close proximity to the sidewalls of the polysilicon gate that partially cover the lightly doped source and drain regions;

implanting heavily doped source and drain regions into the substrate using the polysilicon gate and the spacers as an implant mask;

depositing a refractory metal over the polysilicon gate, the spacers and the heavily doped source and drain regions; and reacting the refractory metal with (i) the polysilicon gate to form a silicide contact on the polysilicon gate and consume at least one-half of the polysilicon gate without entirely consuming the polysilicon gate; (ii) the heavily doped source region to form a silicide contact on a source that includes the lightly and heavily doped source regions, and (iii) the heavily doped drain region to form a silicide contact on a drain that includes the lightly and heavily doped drain regions.

37. The method of claim 36, wherein the silicide contact has a thickness that is at least two times that of the polysilicon gate after reacting the refractory metal with the polysilicon gate.

38. The method of claim 36, wherein the polysilicon gate has a thickness of at most 500 angstroms after reacting the refractory metal with the polysilicon gate.

39. The method of claim 36, wherein a bottom surface of the polysilicon gate is essentially undoped before reacting the refractory metal with the polysilicon gate, and reacting the refractory metal with the polysilicon gate pushes a dopant in the polysilicon gate towards the substrate by way of a resultant interface between the silicide contact and the polysilicon gate to provide a substantial concentration of the dopant at the bottom surface of the polysilicon gate without pushing essentially any of the dopant through the gate insulator into the substrate.

40. The method of claim 36, wherein a lower region of the polysilicon gate adjacent to a bottom surface of the polysilicon gate is essentially undoped before reacting the refractory metal with the polysilicon gate, and reacting the refractory metal with the polysilicon gate consumes all of the polysilicon gate except for the lower region of the polysilicon gate and pushes a dopant in the polysilicon gate towards the substrate by way of a resultant interface between the silicide contact and the polysilicon gate to provide a substantial concentration of the dopant in essentially all of the lower region of the polysilicon gate without pushing essentially any of the dopant through the gate insulator into the substrate.

* * * * *

UNITED STATES PATENT AND TRADEMARK OFFICE
CERTIFICATE OF CORRECTION

PATENT NO.     : 5,851,891
ISSUE DATE     : December 22, 1998
INVENTOR(S)    : Dawson, Robert; Fulford, H. Jim, Jr.; Gardner, Mark I.; Hause, Frederick N.; Michael, Mark W.; Bradley, Moore T.; Wristers, Derick J.

It is certified that error appears in the above-identified patent and that said Letters Patent is hereby corrected as shown below:

Column 5, line 9; please delete "the" before the word "gate".

Signed and Sealed this

Twenty-fourth Day of August, 1999

Attest:

Q. TODD DICKINSON

*Attesting Officer*      *Acting Commissioner of Patents and Trademarks*